(12) United States Patent
Ono et al.

(10) Patent No.: US 8,338,950 B2
(45) Date of Patent: Dec. 25, 2012

(54) ELECTRONIC COMPONENT

(75) Inventors: Kazuyuki Ono, Anjo (JP); Yoshio Tanaka, Koka (JP); Kiyoshi Nakajima, Higashiomi (JP); Naoto Kuratani, Kameoka (JP); Tomofumi Maekawa, Osaka (JP)

(73) Assignee: OMRON Corporation, Kyoto (JP)

( * ) Notice: Subject to any disclaimer, the term of this patent is extended or adjusted under 35 U.S.C. 154(b) by 358 days.

(21) Appl. No.: 12/674,701

(22) PCT Filed: Feb. 17, 2009

(86) PCT No.: PCT/JP2009/000637
§ 371 (c)(1),
(2), (4) Date: May 7, 2010

(87) PCT Pub. No.: WO2010/001504
PCT Pub. Date: Jan. 7, 2010

(65) Prior Publication Data
US 2012/0139111 A1 Jun. 7, 2012

(30) Foreign Application Priority Data
Jul. 2, 2008 (JP) ................. 2008-173126

(51) Int. Cl.
*H01L 23/488* (2006.01)

(52) U.S. Cl. . 257/741; 257/704; 257/729; 257/E23.023; 438/125; 438/650

(58) Field of Classification Search .................. 257/741, 257/704, 729, E23.023, E23.003; 438/125, 438/650, 686
See application file for complete search history.

(56) References Cited

U.S. PATENT DOCUMENTS

| 5,886,876 A * | 3/1999 | Yamaguchi | 361/767 |
| 5,907,189 A * | 5/1999 | Mertol | 257/787 |
| 7,166,910 B2 | 1/2007 | Minervini | |

FOREIGN PATENT DOCUMENTS

| JP | 9-262915 A | 10/1997 |
| JP | 2001-210754 A | 8/2001 |
| JP | 2008-109649 A | 5/2008 |
| JP | 2008-147266 A | 6/2008 |
| WO | 2006/089638 A1 | 8/2006 |

OTHER PUBLICATIONS

International Search Report w/translation from PCT/JP2009/000637 dated 3/24/09 (4 pages).

* cited by examiner

*Primary Examiner* — Thinh T Nguyen
(74) *Attorney, Agent, or Firm* — Osha Liang LLP

(57) ABSTRACT

An electronic component has a substrate, a die bonding pad provided on an upper surface of the substrate, a semiconductor element bonded onto the die bonding pad by a die bonding resin, a conductive pattern disposed adjacent to the die bonding pad, and a coating member covering the conductive pattern. At least an outer peripheral portion of a surface of the die bonding pad is made of an inorganic material. The inorganic material of the outer peripheral portion is exposed. The die bonding pad and the conductive pattern are separated by an air gap such that the coating member does not come into contact with the die bonding pad.

5 Claims, 12 Drawing Sheets

PRIOR ART

PRIOR ART

PRIOR ART

ELECTRONIC COMPONENT

TECHNICAL FIELD

The present invention relates to an electronic component, specifically to an electronic component in which a semiconductor element such as a sensor chip and an electronic circuit is mounted on a substrate.

BACKGROUND ART

For example, Patent Document 1 discloses an electronic component (microphone package) in which the semiconductor element is mounted on the printed substrate while covered with a cap. In the electronic component disclosed in Patent Document 1, as illustrated in modes of FIGS. 1 to 3, a microphone 11 produced by utilizing a MEMS technology has a cavity 12 in a central portion of a lower surface thereof, and the lower surface of the microphone 11 is die-bonded to an upper surface of a printed substrate 14 using an epoxy resin 13. During the die bonding of the microphone 11 to the printed substrate 14, when the epoxy resin 13 held down by the microphone 11 flows in the cavity 12, a volume of the cavity 12 varies due to the flowing-in resin, or a thickness of the epoxy resin 13 between the microphone 11 and the printed substrate 14 varies due to flow-out of the epoxy resin 13, whereby possibly a characteristic of the microphone 11 is adversely affected. Therefore, in Patent Document 1, a retaining ring 15 is provided in the upper surface of the printed substrate 14 in the cavity 12 to prevent the die bonding epoxy resin 13 from flowing in the cavity 12, thereby suppressing the adverse affect on the microphone 11.

Specifically, in the mode of FIG. 1, a lower-surface inner peripheral portion of the microphone 11 overlaps retaining ring 15, and a lower-surface outer peripheral portion of the microphone 11 and the printed substrate 14 are bonded by the epoxy resin 13. Therefore, during the die bonding of the microphone 11 with the epoxy resin 13, the retaining ring 15 prevents the epoxy resin 13 from flowing into the cavity 12.

However, in the mode of FIG. 1, because there is no consideration for the epoxy resin 13 flowing to the outside of the microphone 11, the epoxy resin 13 flowing to the outside cannot be suppressed. Therefore, the epoxy resin 13 flows to the outside until the epoxy resin 13 is cured by heat, occasionally the flowing-out epoxy resin 13 reaches a ground pattern 17 that connects a metallic cap 16 to a ground potential. The metallic cap 16 is bonded to the ground pattern 17 by a conductive bonding resin in order that the metallic cap 16 and the printed substrate 14 constitute a Faraday cage to shield external high-frequency noises. When the flowing-out epoxy resin 13 forms a nonconductive coating in a surface of the ground pattern 17 before the metallic cap 16 is bonded, an electric conduction defect is generated between the metallic cap 16 and the ground pattern 17 at that point, and a high-frequency noise shielding property is degraded.

Conventionally, a sufficient distance may be provided between the ground pattern 17 and a region where the microphone 11 is die-bonded. However, when the distance is increased, eventually a footprint of the electronic component is enlarged, and a size of the electronic component is enlarged to prevent the miniaturization of the electronic component.

In the mode of FIG. 2, the whole lower surface of the microphone 11 is bonded to the printed substrate 14 by the epoxy resin 13, the retaining ring 15 is provided in the cavity 12 to block the epoxy resin 13 flowing into the cavity 12.

In the mode of FIG. 3, the thickness of the retaining ring 15 is increased in order to enhance the effect that the retaining ring 15 blocks the epoxy resin 13 in the mode of FIG. 2.

However, in the modes of FIGS. 2 and 3, even if an application amount of the epoxy resin 13 is correctly managed, or even if a pressing force of the microphone 11 is managed so as to be kept constant, the amount of epoxy resin 13 flowing out from the lower surface of the microphone 11 varies depending on the time the applied epoxy resin 13 is cured or a temperature of an external environment, a variation in resin thickness between the lower surface of the microphone 11 and the printed substrate 14 is increased after the curing. As a result, an elastic property changes due to the variation in volume of the cavity 12 or the variation in thickness of the epoxy resin 13, and the characteristic of the microphone 11 may be affected.

Conventionally, the external environment may be strictly managed in an assembly process, and process management is strictly performed such that the time to perform resin baking (a process for curing the epoxy resin 13 by heating) since the epoxy resin 13 is applied is shortened. However, from the viewpoint of cost, undesirably expensive environmental facilities are required in order to strictly manage the external environment in the assembly process. When the time to perform the resin baking since the epoxy resin 13 is applied is shortened, it is necessary to diligently put the electronic component in a baking furnace. Therefore, temperature management of the baking furnace becomes difficult while labor cost is increased, which results in undesirable cost increase.

Further, in the mode of FIG. 2, because the retaining ring 15 is formed by a conductor pattern of the printed substrate 14, the microphone 11 is fixed by the epoxy resin 13 to the region where the conductor pattern of the printed substrate 14 is removed. Because the conductor pattern of the printed substrate 14 functions to shield the external high-frequency noise along with the metallic cap, the high-frequency noise shielding property is degraded immediately below the microphone 11 in the mode of FIG. 2. At the same time, because the conductor pattern of the printed substrate 14 largely contributes to whole rigidity of the electronic component, the rigidity of the electronic component is degraded by removing the conductor pattern in the region, which possibly generates the adverse affect on the function of the electronic component.

On the other hand, in the mode of FIG. 3, in order to provide the retaining ring 15 having the large thickness, it is necessary that the retaining ring 15 be formed by adding another member different from the conductor pattern of the printed substrate 14, which unfortunately results in the cost increase.

Patent Document 1: U.S. Pat. No. 7,166,910

SUMMARY OF INVENTION

One or more embodiments of the present invention provides an electronic component that can prevent the die bonding resin, which fixes the semiconductor element onto the substrate, from flowing out from the die bonding region and can stabilize the characteristic of the semiconductor element.

In accordance with one aspect of the present invention, there is provided an electronic component, in which a die bonding pad is provided in an upper surface of a substrate, at least an outer peripheral portion of a surface of the die bonding pad is made of an inorganic material, the inorganic material of the outer peripheral portion is exposed, and a semiconductor element is bonded onto the die bonding pad by a die bonding resin, wherein the die bonding pad and a conductive pattern adjacent to the die bonding pad are separated by an air gap such that a coating member with which the conductive pattern is covered does not come into contact with the die bonding pad.

According to the electronic component of one aspect of the invention, in the upper surface of the substrate, at least the outer peripheral portion of the surface is made of the inorganic material, the die bonding pad to which the inorganic material of the outer peripheral portion is exposed is provided, and the semiconductor element is bonded onto the pad by the die bonding resin. Therefore, the die bonding resin maintains a large contact angle to the inorganic material at the end of the die bonding pad, and the die bonding resin hardly flows to the outside of the die bonding pad. The die bonding pad and the conductive pattern adjacent to the die bonding pad is separated by the air gap such that the coating member with which the conductive pattern is coated does not come into contact with the die bonding pad. Therefore, even if the coating member having the good wettability to the die bonding resin is applied to the adjacent conductive pattern, the die bonding resin does not come into contact with the coating member, and the die bonding resin hardly flows to the outside of the die bonding pad.

Accordingly, because the ground electrode to which the conductive cap is joined is not coated with the die bonding resin, the conductive cap is sufficiently joined to the ground electrode, and the high-frequency noise shielding property is hardly lowered. Because the die bonding resin hardly flows to the outside, the thickness of the die bonding resin between the semiconductor element and the die bonding pad can be controlled by the bonding resin application amount to decrease the variation in thickness of the die bonding resin between the semiconductor element and the die bonding pad. Because the die bonding pad is located below the semiconductor element, there is no risk of lowering the strength of the substrate or electronic component unlike the conventional technique.

In the electronic component according to one aspect of the present invention, the inorganic material is at least one of Cu and Au. In the inorganic materials, Cu and Au have particularly low wettability to the die bonding resin, so that Cu or Au can be used as the inorganic material to enhance the effect that prevent the flow-out of the die bonding resin.

In the electronic component according to another aspect of the present invention, the substrate is a printed substrate, and a main part of the die bonding pad is made of a material identical to that of a conductive pattern of the printed substrate. Accordingly, the die bonding pad is prepared by utilizing the conductive pattern of the printed substrate, so that the cost of the electronic component can be suppressed.

In the electronic component according to still another aspect of the present invention, a main part of the die bonding pad is made of Cu, and at least the outer peripheral portion in the surface of the die bonding pad is made of Au that is of the inorganic material. Accordingly, a main part of the die bonding pad is made of Cu, so that the die bonding pad can be prepared by utilizing the conductive pattern of the printed substrate to suppress the cost of the electronic component. Because the surface outer peripheral portion of the die bonding pad is made of Au, the effect that prevents the flow-out of the die bonding resin can be enhanced by lowering wettability of the die bonding resin.

In the electronic component according to further still another aspect of the present invention, the coating member is applied to a region except the outer peripheral portion in the surface of the die bonding pad. Because the die bonding resin has higher bonding strength to the coating member rather than the inorganic material, the bonding strength of the semiconductor element can be enhanced by applying the coating member to the region except the outer peripheral portion of the die bonding pad.

Figure 1:
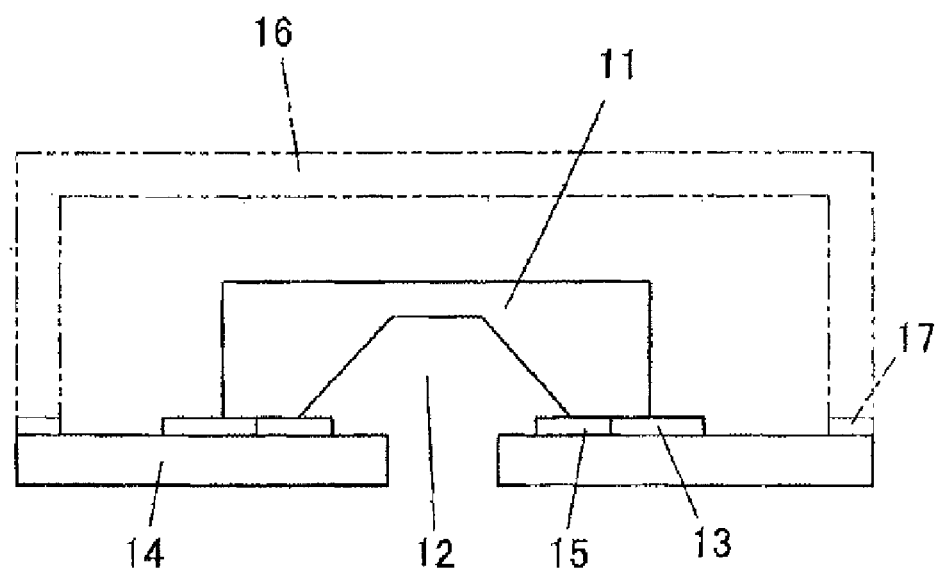
FIG. 1 is a sectional view illustrating a mode of an electronic component disclosed in Patent Document 1.
Figure 2:
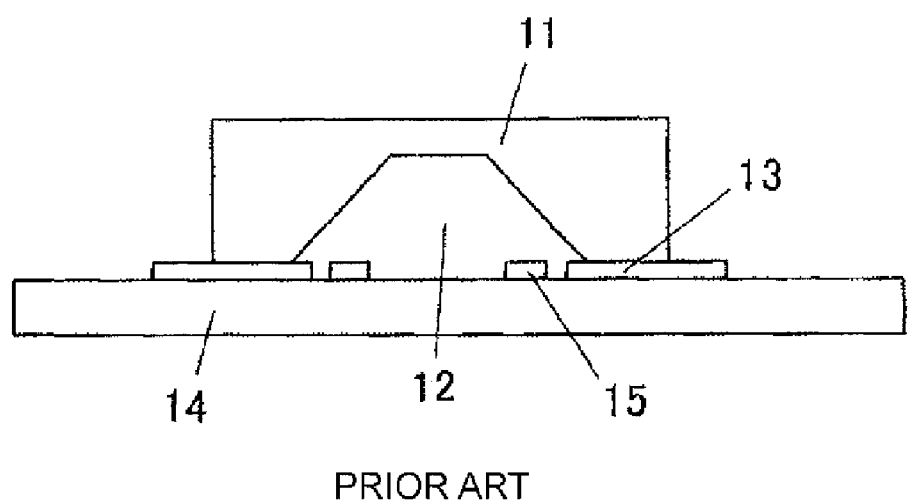
FIG. 2 is a sectional view illustrating another mode of the electronic component disclosed in Patent Document 1.
Figure 3:
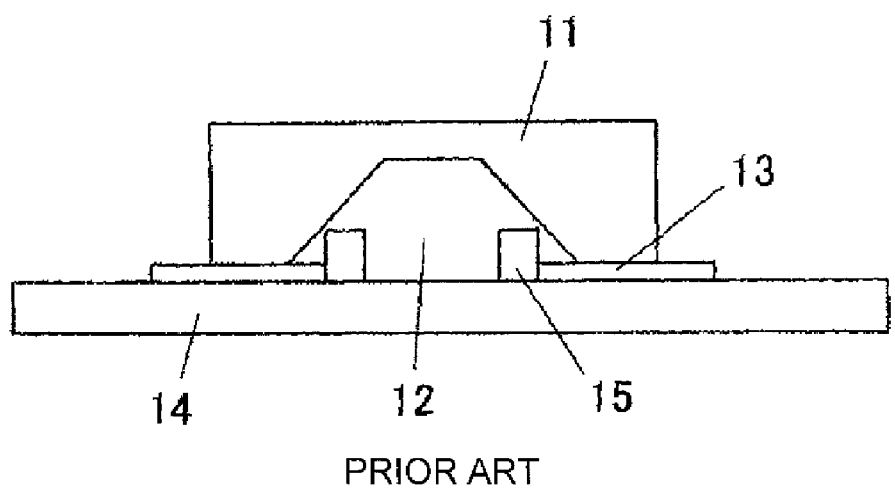
FIG. 3 is a sectional view illustrating still another mode of the electronic component disclosed in Patent Document 1.

DESCRIPTION OF SYMBOLS 51 electronic component
52 substrate
52a substrate core material
53 semiconductor element
53a void
55 die bonding pad
56 pad
57 ground electrode
58 and 59 surface-side ground pattern
60 groove
61a conductive pattern section
61b inorganic material
65 through-hole
66 through-hole
67 solder resist
68 die bonding resin
69 bonding wire

DETAILED DESCRIPTION

Embodiments of the invention will be described below with reference to accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 4:
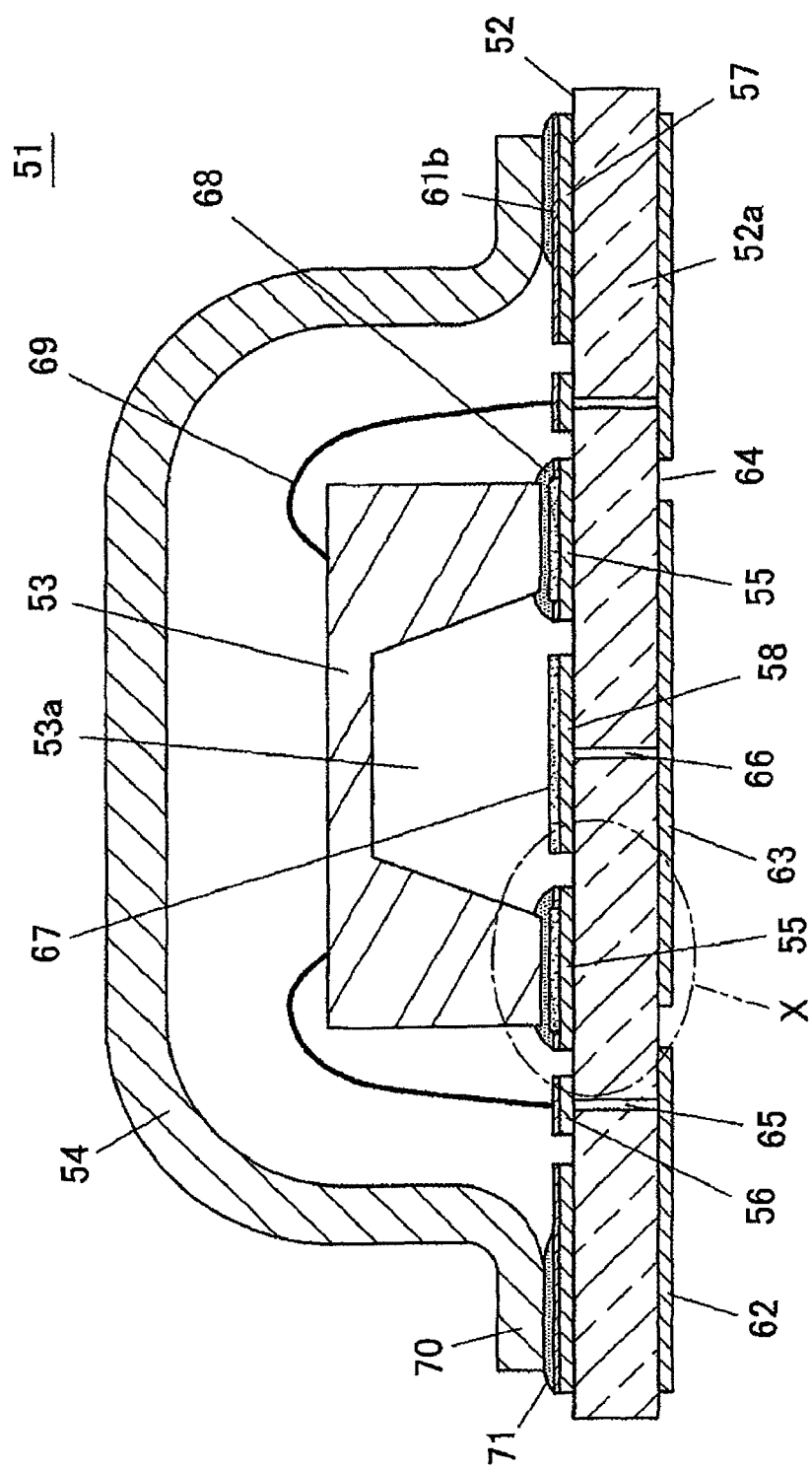
FIG. 4 is a sectional view illustrating a structure of an electronic component according to a first embodiment of the invention.
Figure 5:
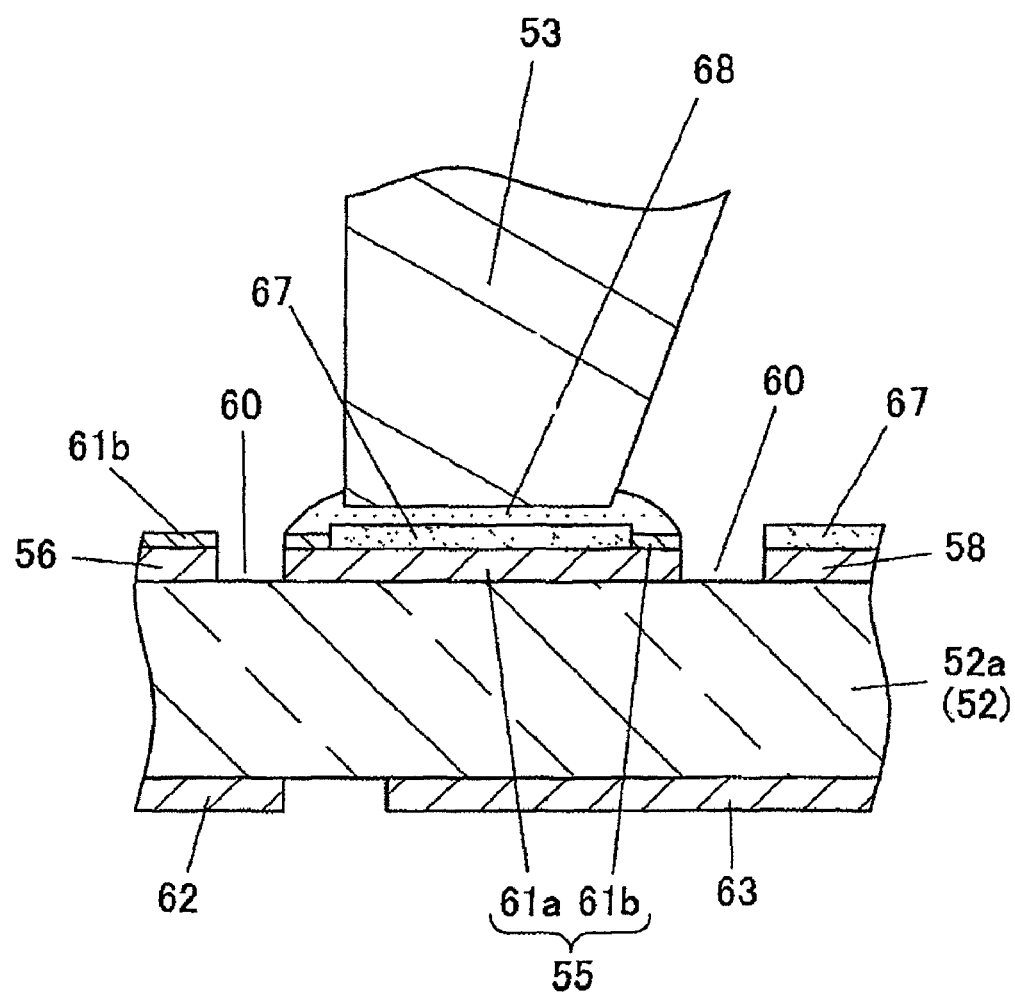
FIG. 5 is an enlarged view of an X portion of FIG. 4.
Figure 6:
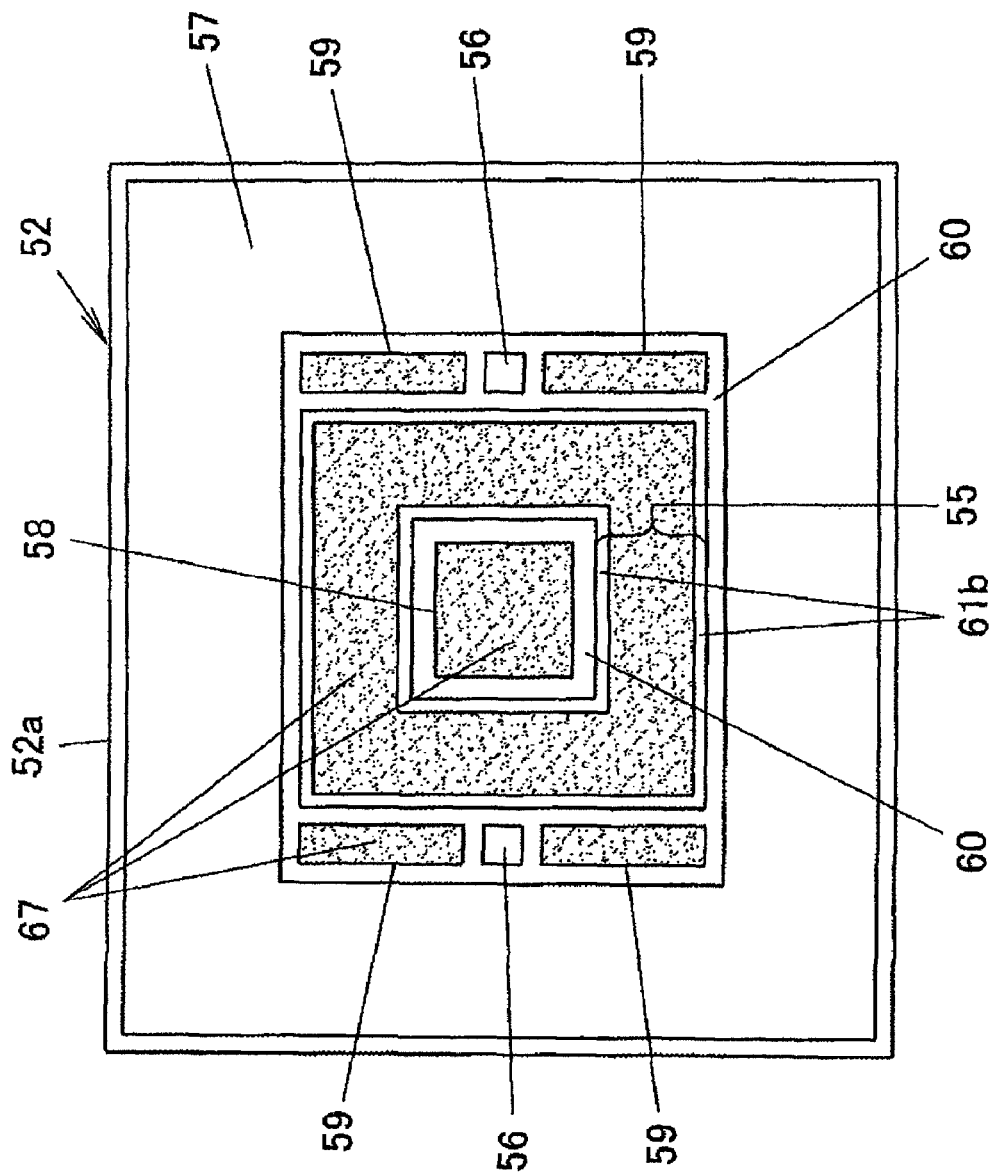
FIG. 6 is a plan view illustrating a substrate for the electronic component.

FIG. 4 is a sectional view illustrating a structure of an electronic component according to a first embodiment of the invention, and FIG. 5 is an enlarged view of an X portion of FIG. 4. FIG. 6 is a plan view of a substrate. In an electronic component 51, a semiconductor element 53 is mounted on an upper surface of a substrate 52, and the semiconductor element 53 is accommodated in a package (Faraday cage) including the substrate 52 and a conductive cap 54.

The substrate 52 is formed by a printed substrate. As illustrated in FIG. 6, a die bonding pad 55, a wire bonding pad 56, a ground electrode 57, and the like are formed in an upper surface of the substrate 52 by a conductive pattern in which a metallic thin film that is made of Cu or the like while bonded to an upper surface of an insulating plate 52a is patterned. The ground electrode 57 is formed in an outer peripheral portion of the substrate 52 so as to surround the die bonding pad 55 and the pad 56, and the pad 56 is disposed near the die bonding pad 55.

It is assumed that the semiconductor element 53 has a cavity in a central portion of a square-ring-shape lower surface thereof. Therefore, the die bonding pad 55 is also formed into a square ring shape according to the square-ring-shape lower surface. In a region inside the ground electrode 57, surface-side ground patterns 58 and 59 are formed by a conductive pattern in a region where the die bonding pad 55 or the pad 56 does not exist. Particularly the square surface-side ground pattern 58 is provided inside the die bonding pad 55.

The die bonding pad 55, the pad 56, the ground electrode 57, and the surface-side ground patterns 58 and 59 are separated from one another by grooves 60 (air gap). As used herein, the groove 60 shall mean a region where a substrate core material 52a is exposed to the bottom surface while the conductive patterns are separated from each other. The groove 60 is formed by etching a metallic thin film, and the groove 60 has a width of about 0.10 mm. Alternatively, the surface-side ground pattern 59 may be joined to or integral with the ground electrode 57.

The region except the outer peripheral portion and inner peripheral portion in the upper surface of the die bonding pad 55 is coated with a solder resist 67 in order to protect the surface of the conductor pattern. The whole upper surfaces of the surface-side ground patterns 58 and 59 are also coated with the solder resist 67. After the solder resist 67 is applied to the surface of the substrate 52 with an even thickness by screen print of the solder resist in a melted state, the solder resist 67 is cured by heating. In the first embodiment, the solder resist is used as the coating member. Alternatively, for example, a silk pattern may be used.

As illustrated in FIG. 4, in the conductive pattern, the region exposed from the solder resist 67, that is, the ground electrode 57, the pad 56, and the inner peripheral portion and outer peripheral portion of the die bonding pad 55 are coated with an inorganic material 61b (such as Au plating) having low wettability to the die bonding resin.

Therefore, the die bonding pad 55 is formed by depositing the inorganic material 61b such as Au plating on the outer peripheral portion and inner peripheral portion in a surface of a conductive pattern section 61a formed by the conductive pattern. That is, the die bonding pad 55 includes the conductive pattern section 61a and the inorganic material 61b, and the conductive pattern section 61a (part of conductive pattern) constitutes a main part of the die bonding pad 55. The region except the outer peripheral portion and inner peripheral portion in the surface of the die bonding pad 55 is coated with the solder resist 67. The inner periphery and outer periphery of the die bonding pad 55 are surrounded by the grooves 60, and the die bonding pad 55 is structurally separated from the close conductive pattern, that is, the surface-side ground patterns 58, 59, and 56. The solder resist 67 applied to the adjacent conductive pattern, that is, the solder resist 67 applied to the surface-side ground patterns 58 and 59 is formed so as not to come into contact with the die bonding pad 55, preferably so as not to intrude into the groove 60.

In the lower surface of the substrate 52, a lead electrode 62 and a rear-surface-side ground pattern 63 are formed by a conductive pattern in which the metallic thin film that is made of Cu or the like while bonded to the lower surface of the lower surface of the insulating plate 52a is patterned. A whole region where the lead electrode 62 does not exist is substantially coated with the rear-surface-side ground pattern 63, and the lead electrode 62 and the rear-surface-side ground pattern 63 are separated from each other by a groove 64. The lead electrode 62 and the rear-surface-side ground pattern 63 are patterns used to mount the electronic component 51 on the substrate (for example, mother substrate for mobile telephone).

Through-holes are made so as to penetrate from the surface of the substrate core material 52a to the rear surface, the pad 56 is electrically connected to the lead electrode 62 through the through-hole 65, and the die bonding pad 55, the surface-side ground pattern 58, and the ground electrode 57 are connected to the rear-surface-side ground pattern 63 through the through-hole 66.

The semiconductor element 53 is an element such as various sensing sensor chip (such as acoustic sensor, acceleration sensor, and pressure sensor), an LSI, and an ASIC. In the first embodiment, it is assumed that the semiconductor element 53 is an acoustic sensor (or a transducer that converts acoustic vibration into electric energy) that detects acoustic vibration. In the acoustic sensor that is of the semiconductor element 53, a thin film (diaphragm) that detects the acoustic vibration is formed in a central portion, a cavity 53a is formed on a lower surface side of the thin film, and thin film displacement caused by the acoustic vibration is detected by an electrostatic method.

The lower surface of the semiconductor element 53 is formed into a square ring shape so as to surround the cavity 53a, and the lower surface is rigidly bonded onto the die bonding pad 55 by a die bonding resin 68. Bonding resin such as silicone having flexibility is used as the die bonding resin 68. After the die bonding resin 68 applied to a transfer pin (stamper) is transferred onto the die bonding pad 55, the semiconductor element 53 is placed on the die bonding resin 68, the semiconductor element 53 is pressed with an even force, and the die bonding resin 68 is cured by heating to fix the semiconductor element 53. The die bonding resin 68 functions not only to fix the semiconductor element 53 but also to block an excess force from the external environment. The terminal of the semiconductor element 53 and the pad 56 are connected by a bonding wire 69, and therefore the terminal of the semiconductor element 53 electrically leads to the lead electrode 62 in the lower surface. The surface-side ground pattern 58 is located in a lower-surface opening portion of the cavity 53a.

Plural semiconductor elements or other electric/electronic components may be mounted on the upper surface of the substrate 52. The pattern of the metallic thin film may freely be designed according to the mode of the mounted semiconductor element or electric/electronic component.

The cap-shape conductive cap 54 is made of a metallic material having small specific resistance, and a space is formed in the lower surface of the conductive cap 54 in order to accommodate the semiconductor element 53 and the like. A flange 70 extended substantially horizontally is formed in a whole periphery in a lower end portion of the conductive cap 54.

The conductive cap 54 is placed on the substrate 52 such that the semiconductor element 53 and the like are covered therewith, the lower surface of the flange 70 is rigidly joined to the ground electrode 57 by a conductive joining member 71, and the flange 70 is electrically connected to the ground electrode 57 due to the conductivity of the conductive joining member 71. Therefore, a potential at the conductive cap 54 becomes equal to a potential (ground potential) at the rear-surface-side ground pattern 63 in the lower surface of the substrate 52. A material such as conductive epoxy resin (for example, epoxy resin containing silver filler) and solder is used as the conductive joining member 71.

When the mounted semiconductor element 53 is the acoustic sensor, a hole (not illustrated) may be made in a vertex portion of the conductive cap 54 in order to pass the acoustic vibration therethrough. The package including the conductive cap 54 and the substrate 52 may have a sealing structure according to the kind of the accommodated semiconductor element 53. For example, when dust or light is blocked from the outside, it is only necessary to cover the semiconductor element 53 and the like with the package, and it is not always necessary to establish the airtightness. On the other hand, when a humidity resistance or a chemical resistance is required, desirably the package has the airtightness.

In the electronic component 51, the Faraday cage is formed by the substrate 52. The substrate 52 includes the conductive cap 54 that is connected to the ground and the rear-surface-side ground pattern 63 and surface-side ground patterns 58 and 59, which are connected to the ground. Therefore, the semiconductor element 53 can be blocked from the external high-frequency noise to reduce the influence of the external noise on the semiconductor element 53.

The whole surface and whole rear surface of the substrate 52 are substantially coated with the conductive pattern, so that warpage of the substrate 52 caused by a temperature change can be prevented.

In the die bonding pad 55, the solder resist 67 is applied to the region except the outer peripheral portion and inner peripheral portion. The die bonding resin 68 such as silicone has higher bonding strength to the solder resist 67 rather than the Cu conductive pattern section 61a or the Au-plating inorganic material 61b, so that the solder resist 67 can partially be applied to the die bonding pad 55 to enhance the bonding strength of the semiconductor element 53 by the die bonding resin 68.

The outer peripheral portion and inner peripheral portion of the die bonding pad 55 are made of the inorganic material 61b such as Au plating, so that the die bonding resin 68 can be prevented from flowing to the inside or outside of the die bonding pad 55. The reason will be described with reference to FIGS. 7 to 11.

Figure 8:
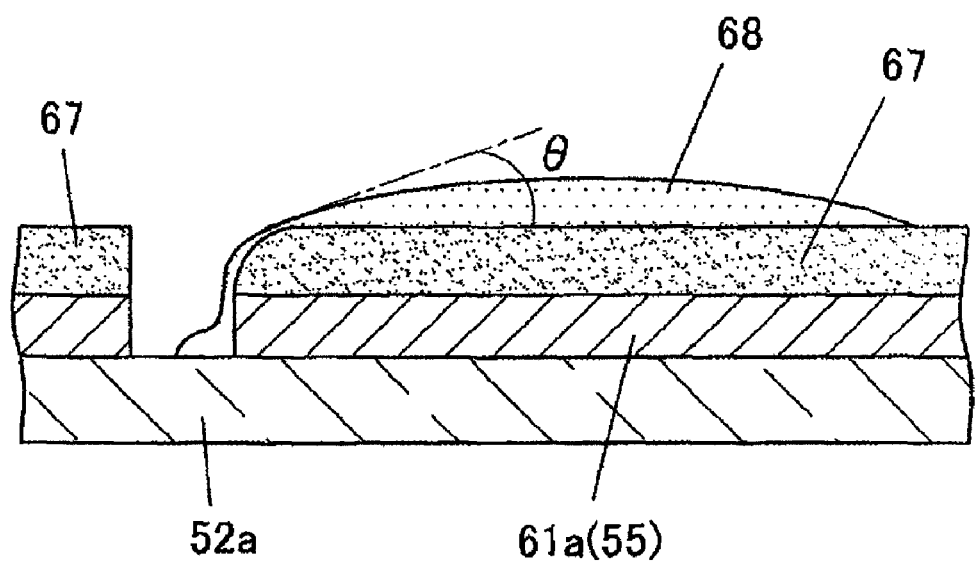
FIG. 8 is a schematic sectional view illustrating a state of the die bonding resin applied to the die bonding pad when a whole surface of the die bonding pad is covered with solder resist.

The flexible resin is used as the die bonding resin 68 in order to relax a characteristic variation factor such as an impact from the outside. Particularly silicone is used as the die bonding resin 68, and silicone is easily flow. The resin such as silicone has the good wettability to the solder resist that is of the same organic material, and the contact angle of the resin is decreased. Additionally the end face of the solder resist hardly becomes a right angle, and the contact angle is easily rounded. When the whole surface of the die bonding pad 55 is coated with the solder resist 67 as illustrated in FIG. 8, a contact angle θ is decreased in applying the die bonding resin 68. As a result, the applied die bonding resin 68 easily flows from the die bonding pad 55 to the outside or inside, the amount of flowing-out die bonding resin 68 is increased with time once the die bonding resin 68 flows out.

Figure 7:
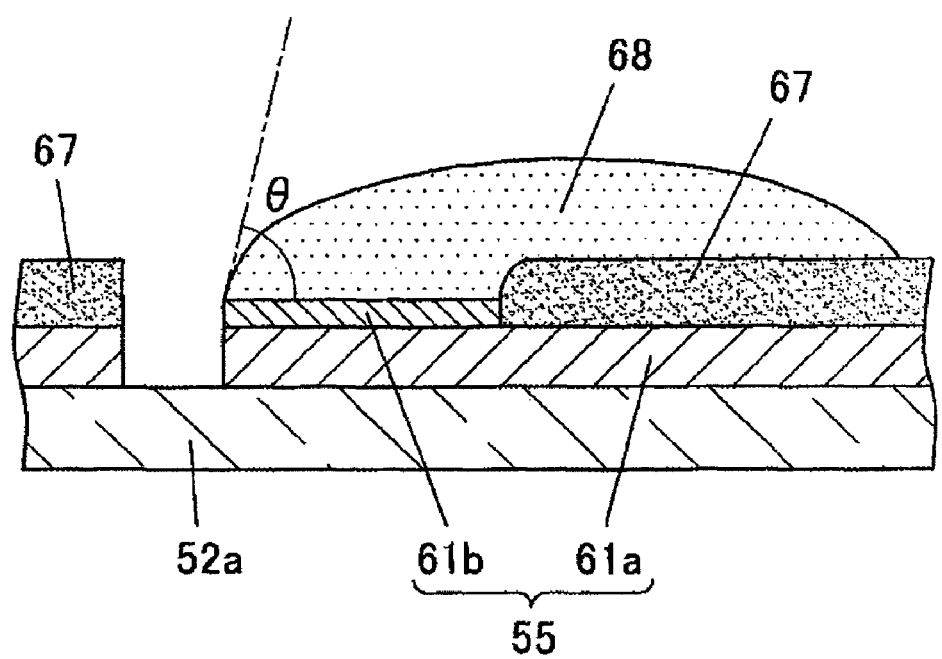
FIG. 7 is a schematic sectional view illustrating a state of die bonding resin applied to a die bonding pad when an inorganic material is formed at an edge of a die bonding pad.

On the other hand, the resin such as silicone has the poor wettability to the inorganic material such as Au and Cu, and the contact angle is increased. Additionally the end face of the resin such as silicone easily becomes the right angle compared with the solder resist. When the edge of the die bonding pad 55 is made of the inorganic material 61b like the first embodiment as illustrated in FIG. 7, the contact angle θ is increased in applying the die bonding resin 68, and the die bonding resin 68 becomes a spherical shape at the edge of the die bonding pad 55. Therefore, the applied die bonding resin 68 hardly flows from the die bonding pad 55 to the outside or inside.

Figure 9:
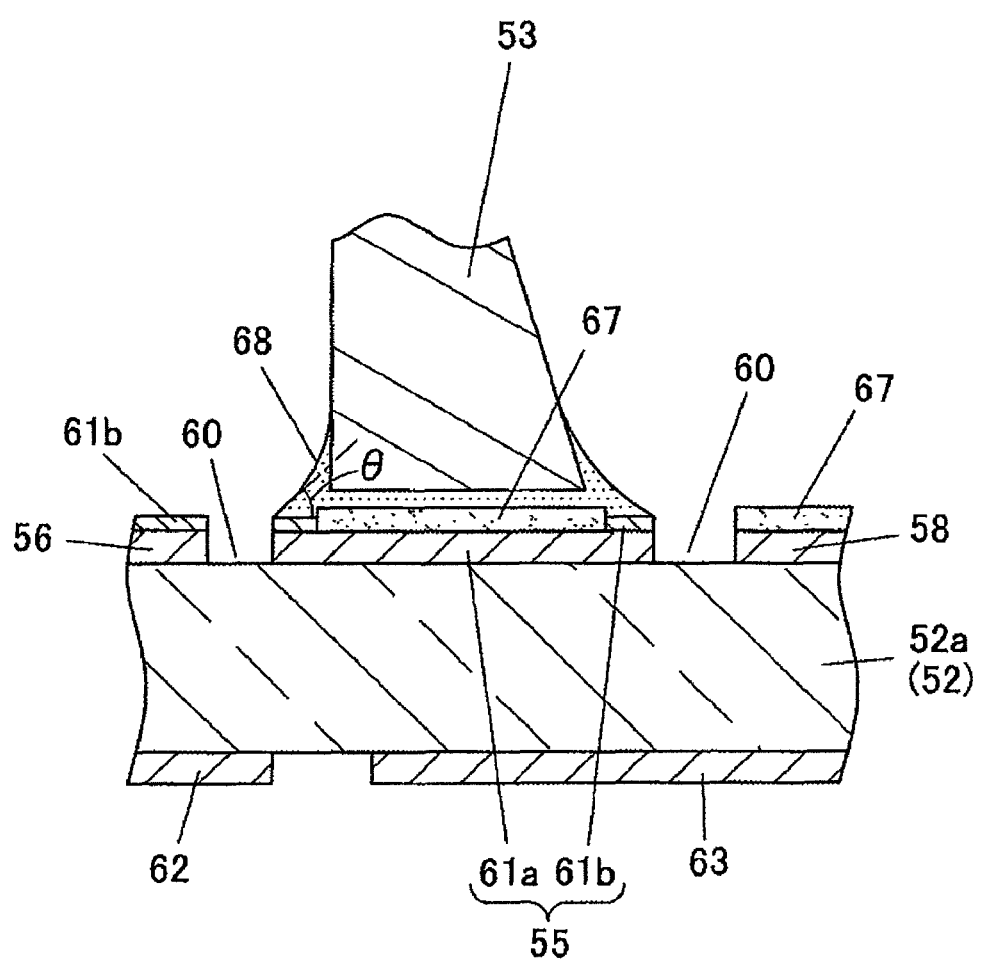
FIG. 9 is a schematic view illustrating different wet states of the die bonding resin that bonds a semiconductor element to the die bonding pad.

However, even if the contact angle θ is increased at the edge of the die bonding pad 55 while the die bonding resin 68 has the poor wettability, occasionally the die bonding resin 68 does not become the spherical shape (convexly curved surface) unlike FIG. 7, but the die bonding resin 68 becomes a concavely curved surface at the edge of the die bonding pad 55 as illustrated in FIG. 9. The wet state of FIG. 9 is easily generated when the wettability of the die bonding resin 68 to the semiconductor element 53 is better than that to the inorganic material 61b.

Figure 10:
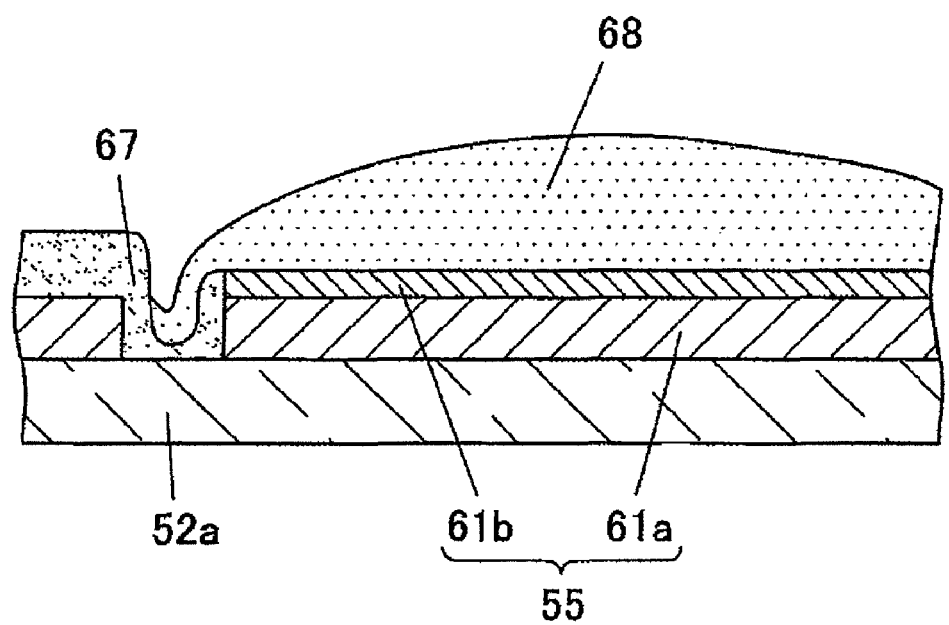
FIG. 10 is a schematic sectional view illustrating a state of the die bonding resin applied to the die bonding pad when the solder resist applied to an adjacent conductive pattern reaches the edge of the die bonding pad.

As illustrated in FIG. 10, in the case where the solder resist 67 applied to the adjacent conductive pattern (surface-side ground patterns 58 and 59) reaches the end face of the die bonding pad 55, the die bonding resin 68 easily flows out from the die bonding pad 55 when the die bonding resin 68 comes into contact with the solder resist 67 at the end of the die bonding pad 55.

On the other hand, in the first embodiment of FIG. 7, when the groove 60 is formed between the adjacent conductive pattern and the die bonding pad 55 such that the solder resist 67 applied to the adjacent conductive pattern is not brought into contact with the die bonding pad 55, the flow-out of the die bonding resin 68 from the die bonding pad 55 to the outside or inside due to the above-described reason is hardly generated.

When the die bonding resin 68 is prevented from flowing out from the die bonding pad 55, part of the ground electrode 57 is covered with the flowing-out die bonding resin 68 to prevent the conductive cap 54 from being joined to the ground electrode 57. Therefore, the phenomenon in which the high-frequency noise shielding property is degraded can be prevented.

When the die bonding resin 68 flows out from the die bonding pad 55, the thickness of the die bonding resin 68 located between the semiconductor element 53 and the die bonding pad 55 is decreased with increasing flow-out amount. However, in the first embodiment, because the flow-out of the die bonding resin 68 can be prevented, the variation in thickness of the die bonding resin 68 can be decreased by managing the application amount of the die bonding resin 68. As a result, joining strength of the semiconductor element 53 can be equalized, the volume of the cavity 53a is equalized, and elasticity of the die bonding resin 68 is equalized, thereby stabilizing quality of the electronic component 51.

Figure 11:
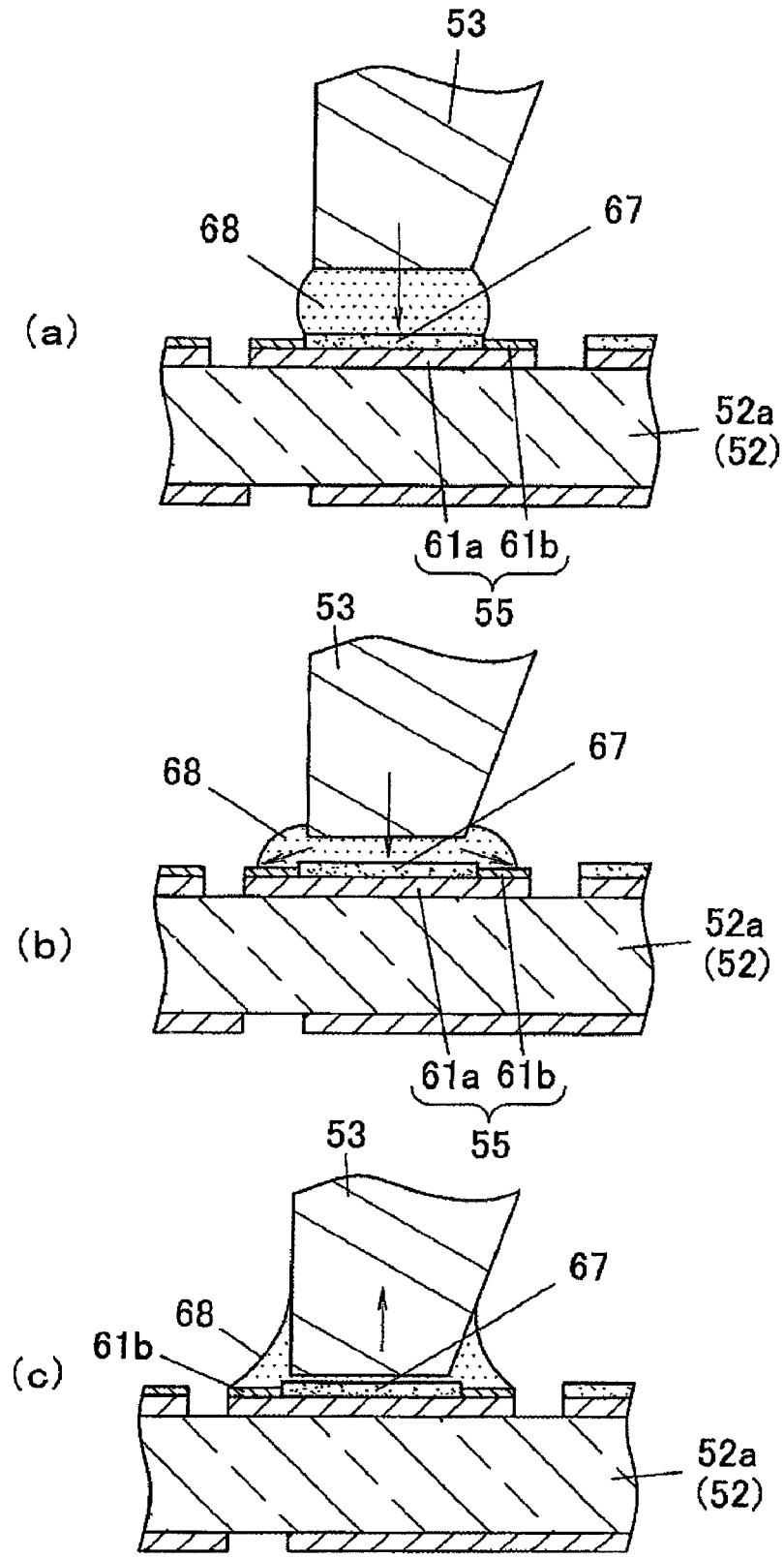
FIG. 11(a) to FIG. 11(c) are explanatory views explaining a state in which the die bonding resin spreads on the die bonding pad when the semiconductor element is bonded to the die bonding pad.

In the first embodiment, because the flow-out of the die bonding resin 68 can be prevented, the thickness of the die bonding resin 68 can be increased in the lower surface of the semiconductor element 53. FIGS. 11(*a*) and (*b*) are views explaining the reason. FIG. 11(*a*) illustrates a state in which the semiconductor element 53 is pressed down on the die bonding pad 55 with the die bonding resin 68 being transferred to the lower surface of the semiconductor element 53. At this point, the die bonding resin 68 is pressed by the pressing-down force applied to the semiconductor element 53 and a self weight of the semiconductor element 53, the die bonding resin 68 is pushed out from a gap between the semiconductor element 53 and the die bonding pad 55 as illustrated in FIG. 11(*b*), and the thickness of the die bonding resin 68 is gradually decreased in the lower surface of the semiconductor element 53.

On the other hand, in the electronic component 51 of the first embodiment, when the flowing-out die bonding resin 68 reaches the end of the die bonding pad 55 as illustrated in FIG. 11(*c*), the die bonding resin 68 is stopped at the end of the die bonding pad 55 (inorganic material 61*b*), thereby stopping the flow-out of the die bonding resin 68 from the lower surface of the semiconductor element 53. As a result, because the die bonding resin 68 that is prevented from flowing out from the lower surface of the semiconductor element 53 to have nowhere to go remains in the lower surface of the semiconductor element 53, the thickness of the die bonding resin 68 is increased in the lower surface of the semiconductor element 53 compared with the case the die bonding pad 55 is coated to the end with the solder resist 67.

When the end of the die bonding pad 55 is made of the inorganic material 61*b*, the effect that can increase the thickness of the die bonding resin 68 below the semiconductor element 53 is obtained in addition to the effect that decreases the variation in thickness of the die bonding resin 68. As a result, the effect that the die bonding resin 68 blocks the excess external force is further intensified.

Further, because the conductive pattern (conductive pattern section 61*a* and surface-side ground pattern 58) remains in the lower surface of the die bonding pad 55, the decrease in strength of the substrate 52 and the cost increase factor of the electronic component 51 are not generated unlike the conventional technique.

Second Embodiment

Figure 12:
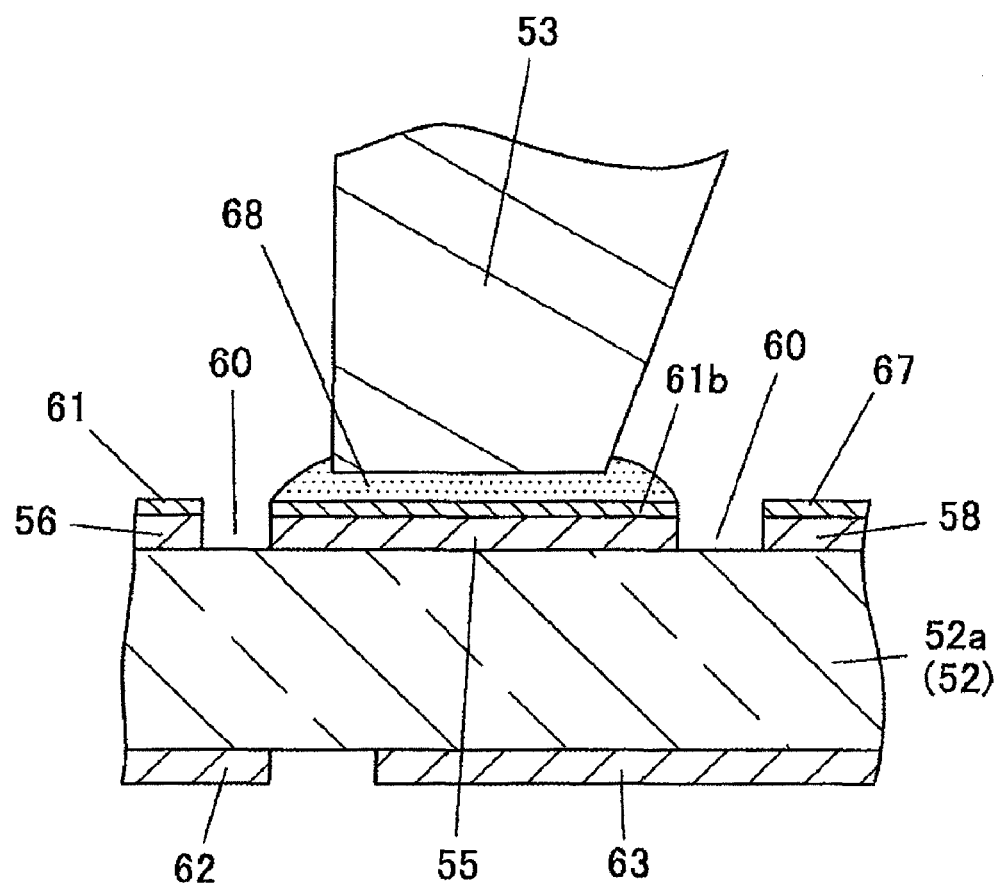
FIG. 12 is a sectional view illustrating a structure of an electronic component according to a second embodiment of the invention.

FIG. 12 is a sectional view illustrating an electronic component according to a second embodiment of the invention, and FIG. 12 illustrates a section corresponding to the point of FIG. 5. In the second embodiment, the solder resist 67 is not provided on the die bonding pad 55. That is, the whole upper surface of the conductive pattern section 61*a* is covered with the inorganic material 61*b* such as Au plating, and the lower surface of the semiconductor element 53 is rigidly joined onto the inorganic material 61*b* by the die bonding resin 68. Even in the structure of FIG. 12, during the die bonding, there is no risk that the die bonding resin 68 flows onto the outer peripheral side and inner peripheral side of the die bonding pad 55. Because the risk that the die bonding resin 68 flows out is eliminated, the variation in thickness of the die bonding resin 68 between the lower surface of the semiconductor element 53 and the die bonding pad 55 can be decreased to stabilize the characteristic of the electronic component.

According to another embodiment of the invention, the inorganic material 61*b* is not provided by Au plating in the outer peripheral portion and inner peripheral portion of the die bonding pad 55 exposed from the solder resist 6, and the Cu conductive pattern section 61*a* may remain exposed. This is because, compared with the solder resist 67, Cu also has the poor wettability to the die bonding resin 68 to be able to increase the contact angle of the die bonding resin 68.

According to another embodiment of the present invention, in mounting the semiconductor element 53 that does not have the cavity portion in the central portion of the lower surface, the die bonding pad 55 may be formed into a rectangular shape according to the semiconductor element 53. When the conductive pattern section 61*a* is made of a material except Cu, the outer peripheral portion and inner peripheral portion of the conductive pattern section 61*a* may be subjected to Au plating or Cu plating.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An electronic component comprising:
    a substrate;
    a die bonding pad provided on an upper surface of the substrate;
    a semiconductor element bonded onto the die bonding pad by a die bonding resin;
    a conductive pattern disposed adjacent to the die bonding pad; and
    a first coating member covering the conductive pattern, wherein
        at least an outer peripheral portion of a surface of the die bonding pad is made of an inorganic material,
        the inorganic material of the outer peripheral portion is exposed, and
        the die bonding pad and the conductive pattern are separated by an air gap such that the first coating member does not come into contact with the die bonding pad.

2. The electronic component according to claim 1, wherein the inorganic material is at least one of Cu and Au.

3. The electronic component according to claim 1, wherein the substrate is a printed substrate, and a main part of the die bonding pad is made of a material identical to that of a conductive pattern of the printed substrate.

4. The electronic component according to claim 1, wherein a main part of the die bonding pad is made of Cu, and at least the outer peripheral portion in the surface of the die bonding pad is made of Au that is of the inorganic material.

5. The electronic component according to claim 1, wherein a second coating member is applied to a region except the outer peripheral portion in the surface of the die bonding pad.

* * * * *